(12) United States Patent
Takano et al.

(10) Patent No.: US 12,469,794 B2
(45) Date of Patent: Nov. 11, 2025

(54) SUBSTRATE HAVING A METAL LAYER COMPRISING A MARKING

(71) Applicant: SKYWORKS SOLUTIONS, INC., Irvine, CA (US)

(72) Inventors: Atsushi Takano, Kadoma (JP); Mitsuhiro Furukawa, Nishinomiya (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 484 days.

(21) Appl. No.: 17/950,243

(22) Filed: Sep. 22, 2022

(65) Prior Publication Data

US 2023/0104665 A1 Apr. 6, 2023

Related U.S. Application Data

(60) Provisional application No. 63/251,183, filed on Oct. 1, 2021.

(51) Int. Cl.

| | | |
|---|---|---|
| *H01L 23/544* | (2006.01) | |
| *B23K 26/06* | (2014.01) | |
| *B23K 101/40* | (2006.01) | |
| *B23K 103/12* | (2006.01) | |
| *H01L 21/027* | (2006.01) | |
| *H01L 21/3213* | (2006.01) | |
| *H01L 23/552* | (2006.01) | |
| *H01L 23/66* | (2006.01) | |

(52) U.S. Cl.
CPC ........ *H01L 23/544* (2013.01); *B23K 26/0661* (2013.01); *H01L 21/0274* (2013.01); *H01L 21/32139* (2013.01); *H01L 23/552* (2013.01); *H01L 23/66* (2013.01); *B23K 2101/40* (2018.08); *B23K 2103/12* (2018.08); *H01L 2223/54406* (2013.01); *H01L 2223/54433* (2013.01); *H01L 2223/6616* (2013.01); *H01L 2223/6644* (2013.01); *H01L 2223/6677* (2013.01)

(58) Field of Classification Search
CPC .............. H01L 23/544; H01L 21/0274; H01L 21/32139; H01L 23/552; H01L 23/66; H01L 2223/54406; H01L 2223/54433; H01L 2223/6616; H01L 2223/6644; H01L 2223/6677; H01L 2223/54486; B23K 26/0661; B23K 2101/40; B23K 2103/12; H03H 9/02157; H03H 9/1014; H03H 3/02; H03H 2003/021
USPC .......................................... 438/703; 257/798
See application file for complete search history.

(56) References Cited

U.S. PATENT DOCUMENTS

| | | | | |
|---|---|---|---|---|
| 2007/0023932 A1* | 2/2007 | Sogawa | .............. | G03F 7/70633 257/E23.179 |
| 2020/0161251 A1* | 5/2020 | Liu | ........................ | H01L 23/544 |

* cited by examiner

*Primary Examiner* — Caleen O Sullivan
(74) *Attorney, Agent, or Firm* — Lando & Anastasi, LLP

(57) ABSTRACT

A method of marking information on a substrate for use in a semiconductor component is provided. The method comprises providing a substrate for use in a semiconductor component, providing a metal layer on a surface of the substrate, and providing a marking within the metal layer. A method of making a die, a radio-frequency module and a wireless mobile device; as well as a substrate, a die, a radio-frequency module and a wireless mobile device is also provided.

16 Claims, 13 Drawing Sheets

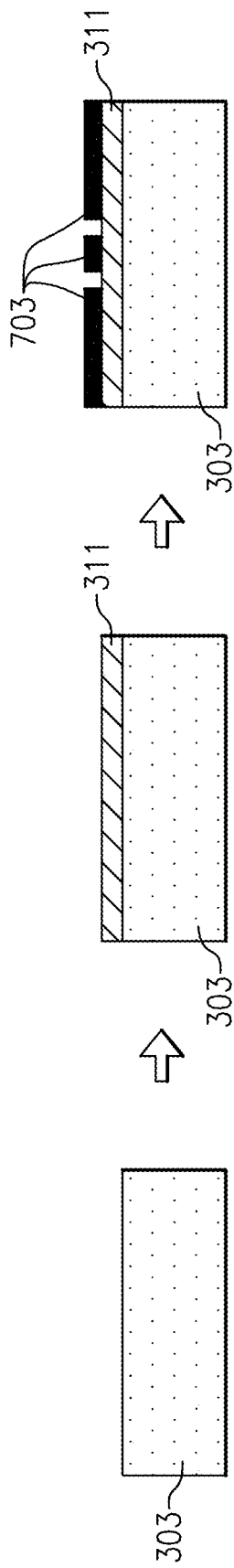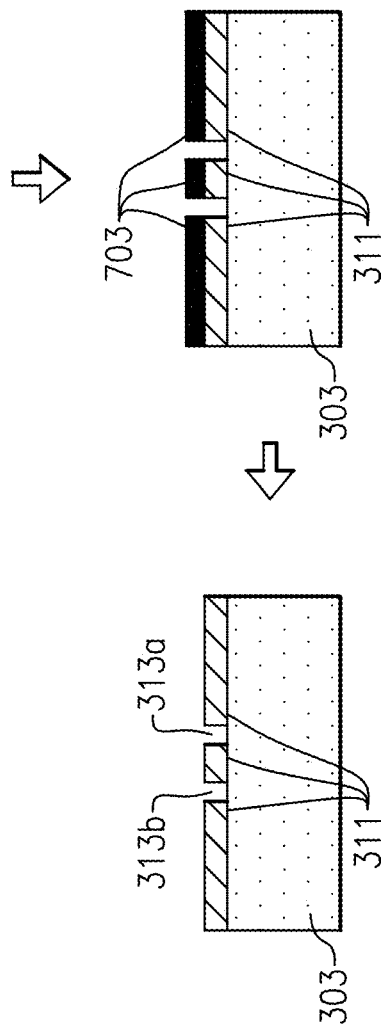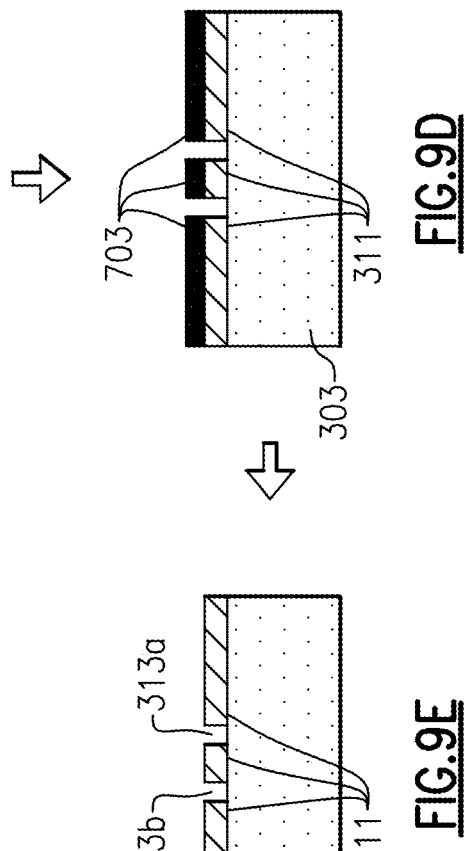

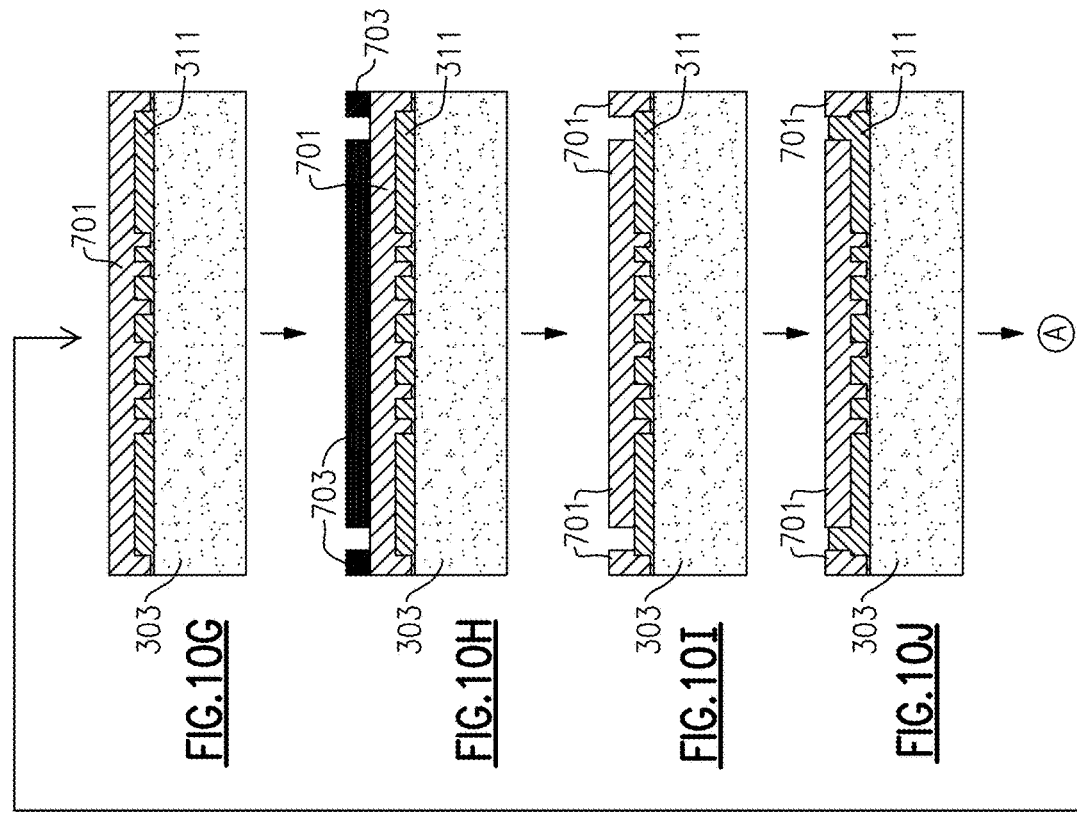
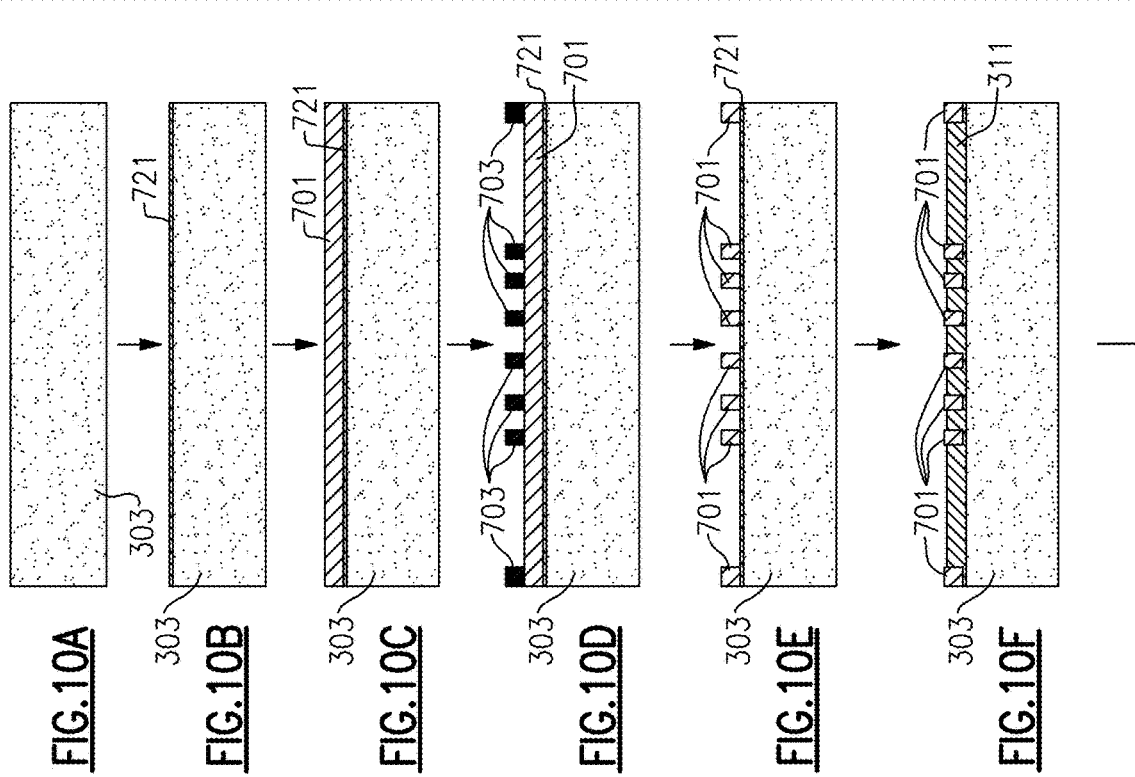

SUBSTRATE HAVING A METAL LAYER COMPRISING A MARKING

CROSS-REFERENCE TO RELATED APPLICATIONS

This application claims priority under 35 U.S.C. § 119(e) to U.S. Provisional Patent Application Ser. No. 63/251,183, titled "SUBSTRATE HAVING A METAL LAYER COMPRISING A MARKING," filed Oct. 1, 2021, the entire contents of which is incorporated herein by reference for all purposes.

BACKGROUND

Field

Embodiments of the invention relate to a substrate, and methods of manufacturing the same, having a metal layer comprising a marking provided on a surface. Embodiments of the invention also relate to dies, radio-frequency modules and wireless mobile devices, and methods of their manufacture.

Description of the Related Technology

Microchips and other types of electronic circuit typically comprise a number of electronic components mounted on a substrate, such as a silicon wafer. These are required to be marked, e.g., with human or machine comprehensible characters, for a number of reasons. For example, silicon chips, or die, used in various electronic components such as radio-frequency front end (RFFE) modules are often made in large batches as part of an assembly line. To ensure quality control and to enable bad batches of die or problematic manufacturing processes to be identified, identifying markings are provided on die. This is done using a laser to etch a marking onto an external surface of the die, typically on an external surface of a silicon wafer upon which the electronic components are provided (i.e., a device wafer) or on an external surface of a silicon wafer disposed over the electronic components and bonded to the device wafer (i.e., a cap wafer).

However, laser etchings are prone to being accidentally removed or made un-readable, for example during a grinding step of a failure analysis process. Such a process may be used if a fault or other problem is detected in an assembled module (i.e., a fault with a component within an assembled module having a device and cap wafer encasing the component). Furthermore, laser etched markings can only be reduced to a minimum size. As developments in manufacturing technology continue, die have become smaller and smaller, meaning that the amount of information (e.g., the number of letters or numbers) that can be etched onto a die is reduced. The available area for marking a chip is further reduced due to the need to have a buffer area around the edge of the die, which can become damaged during manufacture of the die. For example, it may chip during a cutting step. The available area for marking is further limited due to the inaccuracy of laser etching systems, often requiring a relatively large buffer region to ensure that the marking is etched fully on the die.

SUMMARY

According to one embodiment there is provided a method of marking information on a substrate for use in a semiconductor component, the method comprising: providing a substrate for use in a semiconductor component, providing a metal layer on a surface of the substrate, and providing a marking within the metal layer.

In an example, the method further comprises the step of integrating the substrate into a semiconductor component.

In an example, the surface of the substrate is a surface of a silicon wafer or a treated surface of a silicon wafer.

In an example, the marking comprises one or more holes in the metal layer extending through the entire thickness of the metal layer.

In an example, the marking comprises one or more characters.

In an example, the marking comprises one or more letters and/or numbers.

In an example, the resolution of the marking is 10 µm.

In an example, the steps of providing a metal layer on a surface of the substrate and providing a marking within the metal layer include: providing a photoresist in the shape of the marking on the surface of the substrate, and depositing the metal layer around the photoresist to form the metal layer comprising the marking.

In an example, the photoresist in the shape of the marking on the surface of the substrate is provided by: providing photoresist over the surface of the substrate, providing a masking layer over a portion of the photoresist, the masking layer being in the shape of the marking, and developing the photoresist to remove portions of the photoresist not covered by the masking layer, such that the remaining photoresist is in the shape of the marking.

In an example, providing a metal layer on a surface of the substrate such that the metal layer comprises a marking includes: depositing a metal layer on the surface of the substrate, and removing portions of the metal layer such that the metal layer comprises the marking.

In an example, portions of the metal layer are removed by: providing a masking layer over the metal layer on the surface of the substrate, the masking layer comprising an outline of the marking, and removing the regions of the metal layer not covered by the masking layer such that the metal layer comprises the marking.

In an example, the metal layer is removed chemically.

In an example, the substrate comprises one or more cap wafers.

In an example, a marking is provided corresponding to each of the one or more cap wafers and comprises information about the position of that cap wafer on the substrate.

In an example, the marking comprises a coordinate position.

In an example, the method further comprises: providing a device wafer having an electronic component disposed thereon, and bonding the cap wafer and the device wafer such that an inner surface of the cap wafer faces the device wafer, the metal layer comprising the marking being provided on the inner surface of the cap wafer.

In an example, the metal layer is a shielding layer.

In an example, the metal layer is a copper layer.

In an example, the metal layer has a thickness of approximately 5 µm.

In an example, the device wafer comprises a plurality of electronic components arranged in groups of one or more electronic component, each group corresponding to a separate die, wherein the metal layer comprising a marking corresponding to each group.

In an example, the marking corresponding to each group is providing on the inner surface of the cap wafer opposite the one or more electronic component of the corresponding group.

In an example, the method further comprises, subsequent to bonding the cap wafer and the device wafer, separating each die.

In an example, bonding the cap wafer and the device wafer comprises forming a hermetic seal around the electronic component.

In an example, the marking comprises one or more letters and/or numbers and each of the letters and/or numbers are formed backwards on the inner surface of the cap wafer such that when viewed through the cap wafer from an outer surface opposite the inner surface each of the letters and/or numbers are correctly oriented.

In an example, the electronic component comprises one or more of a bulk acoustic wave resonator, a Lamb wave resonator, and a surface acoustic wave resonator.

According to an aspect of the invention there is provided a method of manufacturing a radio-frequency module comprising: manufacturing a die by providing a cap wafer, providing a metal layer on a surface of the cap wafer, providing a marking within the metal layer, providing a device wafer having an electronic component disposed thereon, and bonding the cap wafer and the device wafer such that an inner surface of the cap wafer faces the device wafer, the metal layer comprising the marking being provided on the inner surface of the cap wafer; providing a packaging substrate; and mounting the die on the packaging substrate.

According to an aspect of the invention there is provided a method of manufacturing a wireless mobile device comprising: manufacturing a die by providing a cap wafer, providing a metal layer on a surface of the cap wafer, providing a marking within the metal layer, providing a device wafer having an electronic component disposed thereon, and bonding the cap wafer and the device wafer such that an inner surface of the cap wafer faces the device wafer, the metal layer comprising the marking being provided on the inner surface of the cap wafer; providing a packaging substrate; mounting the die on the packaging substrate to provide a radio-frequency module; and providing one or more antennas in communication with the radio-frequency module.

According to an aspect of the invention there is provided a substrate having information marked thereon for use in a semiconductor component comprising: a substrate for use in a semiconductor component; a metal layer on the surface of the substrate; and a marking within the metal layer.

According to an aspect of the invention there is provided a die comprising: a device wafer having an electronic component disposed thereon; and a cap wafer bonded to the device wafer such that the electronic component is located between the device wafer and the cap wafer, the cap wafer having a metal layer on the inner surface of the cap wafer, the metal layer comprising a marking.

According to an aspect of the invention there is provided a radio-frequency module comprising: a packaging substrate configured to receive a plurality of devices; and a die mounted on the packaging substrate, the die having a device wafer having an electronic component disposed thereon; and a cap wafer bonded to the device wafer such that the electronic component is located between the device wafer and the cap wafer, the cap wafer having a metal layer on the inner surface of the cap wafer, the metal layer comprising a marking.

According to an aspect of the invention there is provided a wireless mobile device comprising: one or more antennas; and a radio-frequency module that communicates with the one or more antennas, the radio-frequency module having a die including a device wafer having an electronic component disposed thereon, and a cap wafer bonded to the device wafer such that the electronic component is located between the device wafer and the cap wafer, the cap wafer having a metal layer on the inner surface of the cap wafer, the metal layer comprising a marking.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIGS. 9A-9E show a method of forming a marking according to aspects of the present invention;

DETAILED DESCRIPTION

Aspects and embodiments described herein are directed to a method for marking a substrate and manufacturing a die including marking a substrate of the die, such as a cap wafer in a way that enables the marking to be both less susceptible to damage that may render it illegible and enables the marking to be reduced in size for use on smaller substrates and die, and/or for enabling more information to be included within the marking on the substrate or die.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
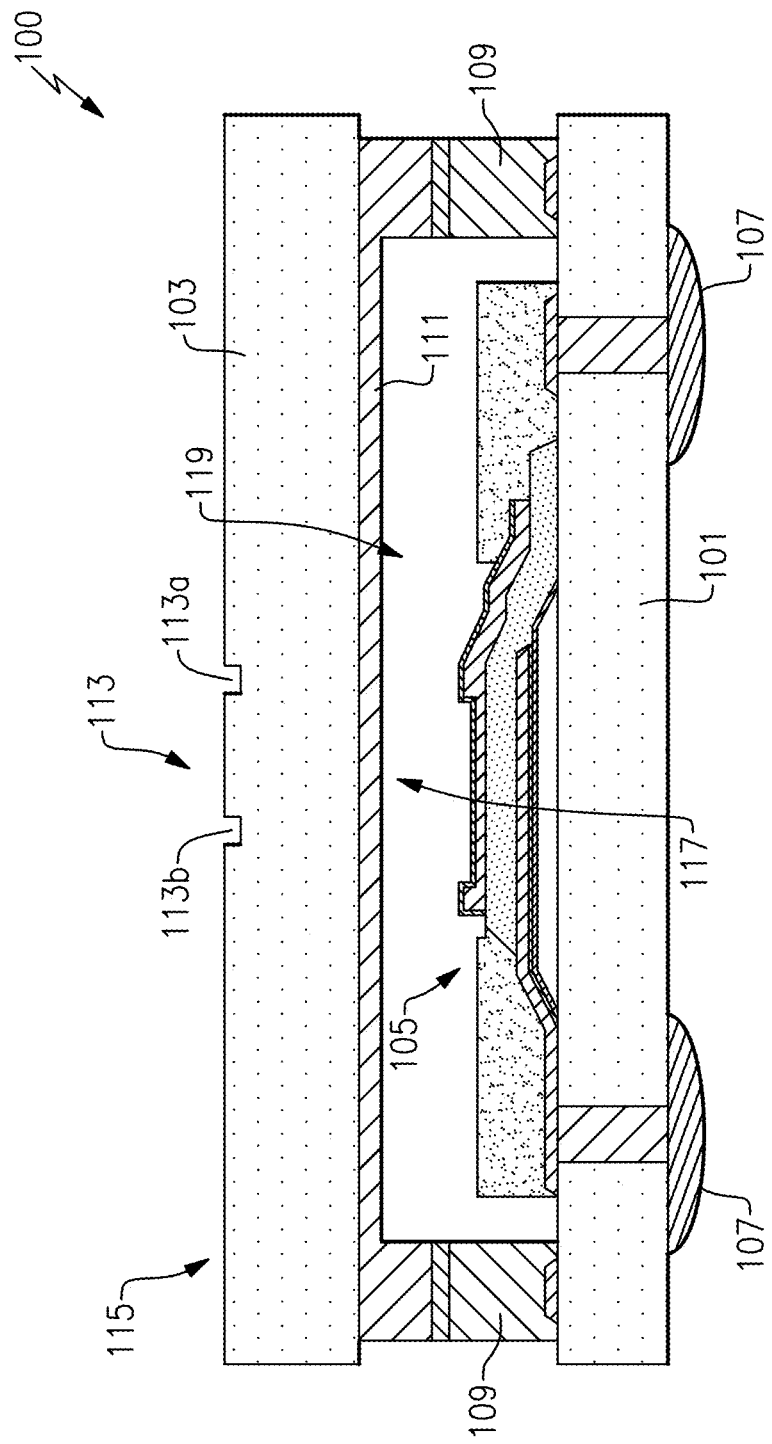
FIG. 1 is a die having a laser etched marking.

FIG. 1 shows an example of a die 100 in cross section having a laser etched marking 113. The die 100 comprises a pair of substrates, device wafer 101 and cap wafer 103, and an electronic component 105. The device wafer 101 and cap wafer 103 are typically made from silicon. The electronic component 105 is disposed on the device wafer 101. In this example, the electronic component 105 is a bulk acoustic wave (BAW) resonator. The cap wafer 103 is disposed parallel and adjacent to the device wafer 101, such that the electronic component 105 is disposed between the device wafer 101 and the cap wafer 103. The cap wafer 103 and device wafer 101 are bonded together, connected via pillars 109. Preferably, a hermetic seal is formed between the device wafer 103, cap wafer 101 and pillars 109 such that the electronic component 105 is provided in a hermetically sealed cavity 119. Contacts 107 enable the electronic component 105 to be connected to other devices and components. A metal layer 111, also called a shielding layer 111, is provided on an inner surface 117 of the cap wafer 103 to prevent (or minimize) electrical interference that may affect the performance of the electronic component 105.

The die 100 is marked with marking 113 on an outer surface 115 of the cap wafer 103. The marking 113 is etched into the cap wafer 103 with a laser, as illustrated by the hole portions 113a, 113b. As can be seen, these exist in the outer surface 115 of the cap wafer 103 and have a finite depth. However, because the marking 113 is on the outer surface 115, it is prone to being damaged through contact with external objects or other environmental effects. Indeed, often a cap wafer 103 will be subject to a grinding process after the marking 113 has been applied to the outer surface to reduce the thickness of the cap wafer 103 and to provide an acceptable finish. Given that the marking 113 has a finite depth, typically much less than the thickness of the cap wafer 103 (which is what is meant by the marking 113 being disposed on the surface of the cap wafer 103), it is possible that during such grinding processes the marking 113 is inadvertently removed.

It is also noted that the marking 113 is disposed in a central region of the cap wafer 103, the central region being a region away from the edges of the cap wafer 103. This is because the lasers used to mark the cap wafer 103 have a limited accuracy, and because the edges of the cap wafers 103 are prone to damage. This provides a limited central region within which the marking 113 can be formed. This is illustrated with respect to FIG. 2.

Figure 2:
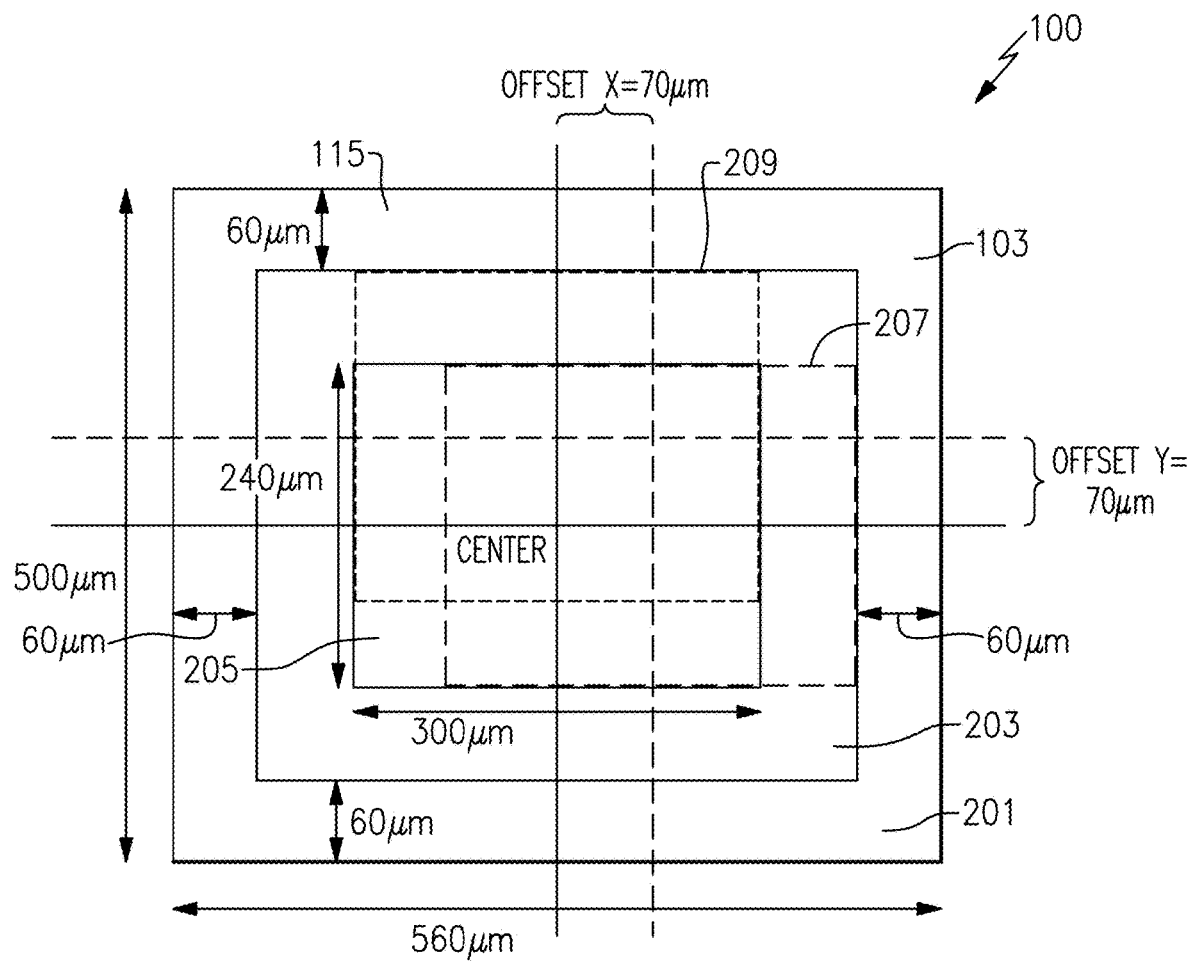
FIG. 2 is an illustration of the region of a die available for laser etching.

FIG. 2 shows a plan view of die 100, showing the outer surface 115 of the cap wafer 103. The cap wafer 103 has dimensions of 560 µm by 500 µm, as illustrated. During manufacturing of the die 100, in particular when the die 100 is cut and separated from other dies manufactured on the same silicon wafer, the edges of the cap wafer 103 are prone to damage. For example, portions of the outer surface 115 around the edge of the cap wafer 103 may chip or shear off from the cap wafer 103. Accordingly, to prevent a marking from being disfigured or lost entirely due to such damage, a boundary region 201 is disposed around the edge of cap wafer 103. In this case, the boundary region is a border 60 µm thick. This leaves a marking region 203 of 440 µm by 380 µm that is safe for marking.

However, the total area of the marking region 203 still cannot be utilized for marking. This is because the lasers used for marking cannot be controlled with enough precision. They can only be positioned with respect to the die 100 with a certain level of accuracy. In the typical example illustrated in FIG. 2, the position of the laser may be offset from the intended position by up to 70 µm. This means that to account for this lack of precision, a further border of 70 µm must be provided within the marking region 203. This accounts for the laser being offset by up to 70 µm in a first direction (e.g., along an x axis), illustrated by box 207, or in a second, perpendicular direction (e.g., along a y axis), illustrated by box 209. Therefore, a safe marking region 205 comprises an area of 300 µm by 240 µm, only 26% of the total area of die 100. Accordingly, only a small portion of the die 100 can actually be utilized for marking. Furthermore, as component sizes reduce, so does the size of the dies upon which they are mounted. Without improvements in manufacturing and the laser etching process, the region in which a die can be marked will reduce further.

Figure 3:
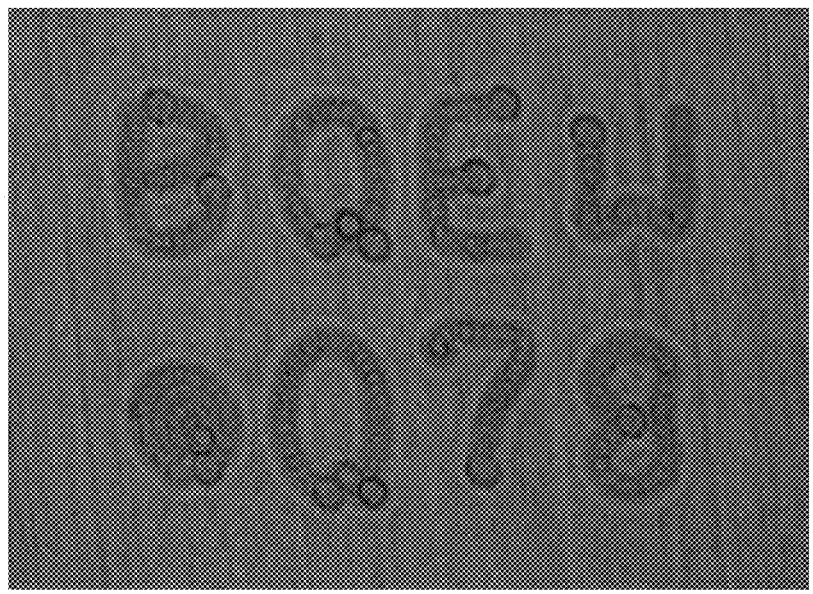
FIG. 3 is a laser etched marking.

The markings are provided on a die for a number of reasons, and may come in a variety of shapes, sizes and compositions, within the limitations of the area available for marking and the accuracy and resolution of the laser being used to etch the marking, as described above. Typically, markings comprise a number of characters (e.g., letters and/or numbers) and/or symbols. An exemplary marking 113 is shown in FIG. 3. The marking 113 of FIG. 3 comprises a top row of letters, the letters "BQEW" and a bottom row comprising, from left to right, a spiral, the letter "Q", and the numbers "78". The letters and numbers specify lot number and wafer number that the die is from, as well as the position of the die on the wafer the die was constructed as part of. The spiral mark specifies the polarity of the die, and is also used to orient the die (e.g., to indicate a "Pin 1" position of the die for connecting to other components). The letters and numbers of the marking 113 have a height of 80 µm, which is typical of the size of character that can be formed by laser etching which has a resolution of around 17 µm (i.e., the thickness of a line formed by laser etching is 17 µm). Whilst a larger die will be able to accommodate all of these markings, many smaller die cannot. This means that all of the information that is desired to be marked onto the die cannot be included with current technologies.

One aspect of the invention provides a method of marking a substrate. A method according to this aspect of the invention is illustrated as a flow diagram in FIG. 4A.

Figure 4A:
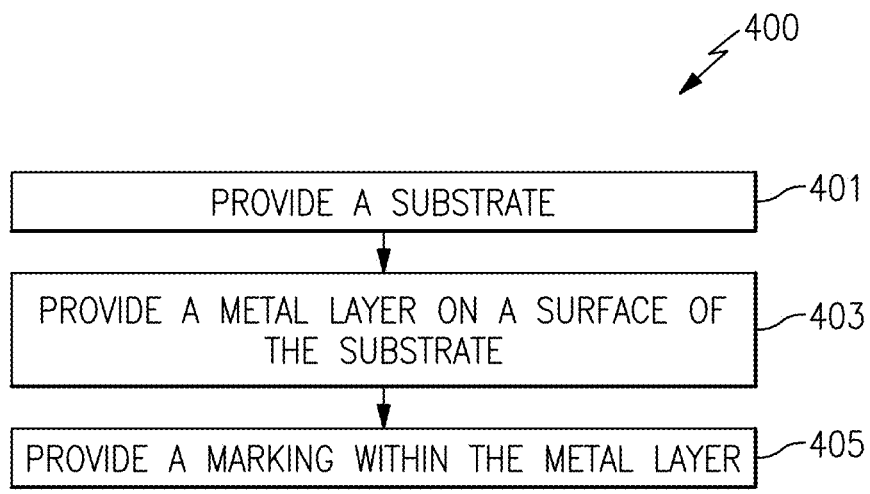
FIG. 4A is a method of marking a substrate according to aspects of the present invention.
Figure 8:
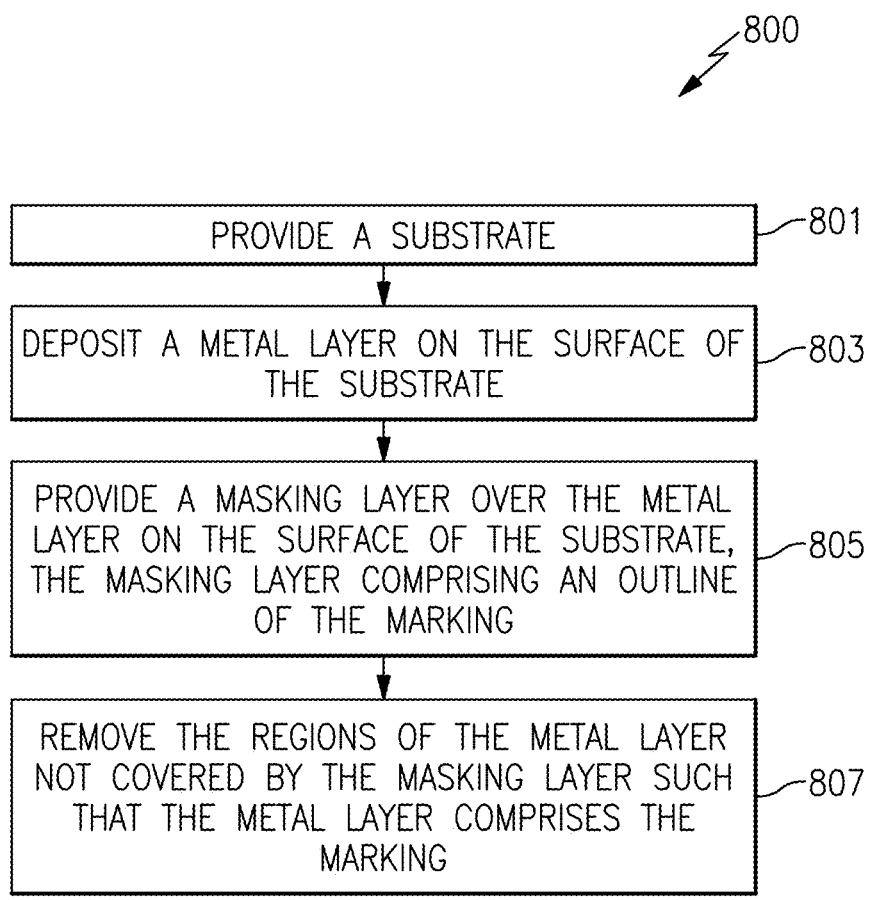
FIG. 8 is a method of forming a marking according to aspects of the present invention.

Method 400 of FIG. 4A begins at step 401 whereby a substrate is provided. Typically, the substrate is a silicon wafer. At step 403, a metal layer is provided on a surface of the substrate and at step 405 a marking is provided in the metal layer. It is noted that steps 403 and 405 may be performed separately, one after the other, or simultaneously (see, for example, FIGS. 6 and 8). The surface of the substrate may be a treated or untreated surface. For example, in the case of the substrate being a silicon wafer, the metal layer may be provided directly onto the silicon or onto another layer disposed in between the metal layer and the silicon. For example, a seed layer may be first provided on the silicon to enable the metal layer to be suitable formed on, and adhered to, the silicon layer. The skilled person will appreciate that any suitable technique for providing a metal layer onto a substrate may be utilized.

The metal layer is preferably a copper layer, with a thickness of approximately 5 µm though other thicknesses can be used, depending upon the application. For example, the metal layer may have a thickness of greater or less than 5 µm, such as 1 µm, 2 µm, 8 µm, 10 µm or 15 µm. Preferably, the marking is in the form of one or more holes in the metal layer (e.g., a hole) in the shape of the marking. For example, if the marking is an "A", then the metal layer may have an "A" shaped hole within it. This may extend throughout the entire depth (i.e., thickness) of the metal layer (i.e., no metal layer is provided within the marking) or through only a portion of the depth of the metal layer (i.e., a reduced amount of metal layer is provided within the marking).

The marking within the metal layer preferably takes the form of one or more characters and/or symbols. For example, the markings may comprise a number of letters (e.g., of the Latin alphabet) and/or numbers (e.g., Arabic numerals), that are recognizable to one or both of humans or machines, e.g., using optical character recognition (OCR) technologies. It will be appreciated that characters from different languages and writing systems may be used, and that characters not part of any current language or writing system, may also be used in the marking. The characters of the marking are preferably smaller than those that can be made using laser etching, allowing more characters to be located in a smaller area on a substrate. For example, the characters may have a resolution of 10 µm, i.e., the thickness of the lines used to form the characters may be 10 µm. Accordingly, as the resolution of laser etching is 17 µm, the markings formed in the metal layer may be less than two thirds of the size of markings formed by laser etching.

Figure 4B:
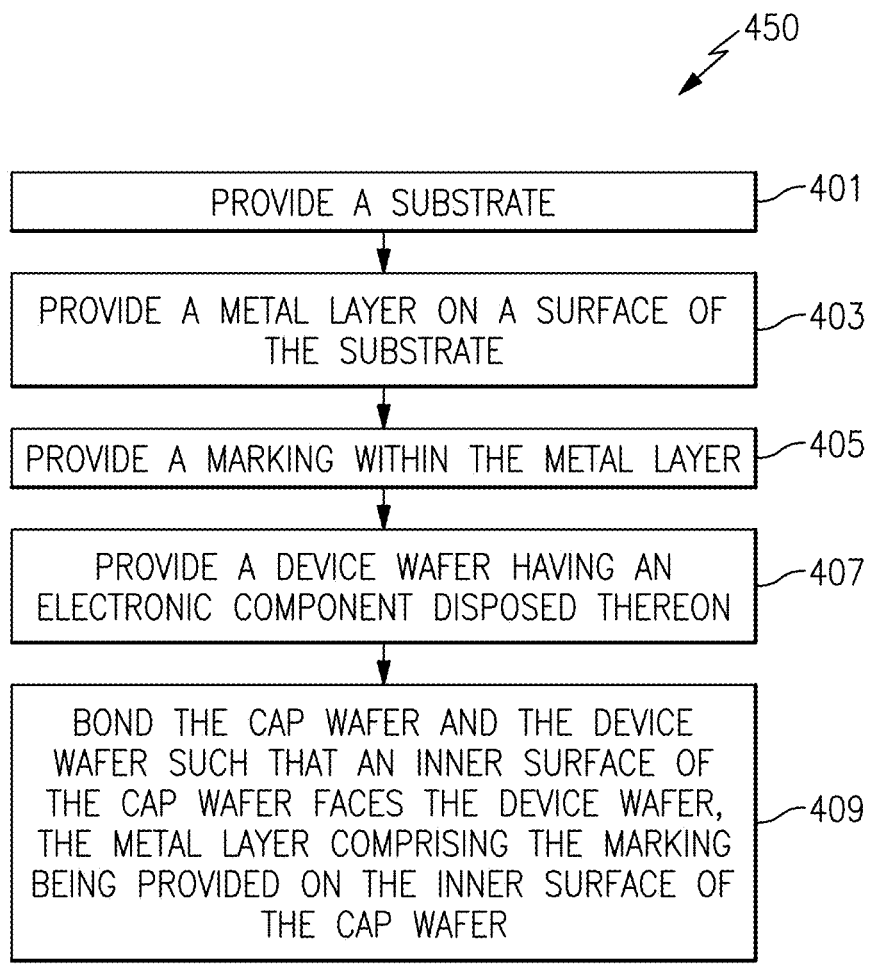
FIG. 4B is a method of manufacturing a die according to aspects of the present invention.

The method 400 of FIG. 4A may also be included as part of a method for manufacturing a die, illustrated in FIG. 4B. This method 450 comprises steps 401 to 405 shown in FIG. 4A and discussed above. In this case, the substrate is a cap wafer. Additionally, the method 450 comprises the step 407 of providing a device wafer having an electronic component disposed thereon and step 409 of bonding the cap wafer and the device wafer. The cap wafer and the device wafer are bonded such that an inner surface of the cap wafer faces the devices wafer, with the metal layer comprising the marking being provided on the inner surface of the cap wafer. In other words, the cap wafer and the device wafer are bonded so that the surface of the cap wafer with the metal layer on faces the device wafer.

When provided on an inner surface of a cap wafer in this manner, the metal layer is preferably a shielding layer configured to prevent, reduce or minimize the electrical interference caused by external electromagnetic waves on the electronic device provided between the cap wafer and the device wafer. For example, the metal layer may be a shielding layer made from copper. Whilst providing the marking in the shielding layer may result in a reduction in the thickness of the shielding layer, or indeed the complete removal of the shielding layer, where the marking is, if the markings are made small, and comprise characters or shapes for which the area occupied by the character or shape (e.g., the smallest rectangle that the character or shape can fit within) that predominantly is not the marking itself, then the detrimental effect on the shielding layer is negligible. That is, because most of the area in which the marking is located remains metal, and only small, thin lines or other shapes of the metal are not present, the shielding layer still fulfills its shielding function. It is also preferable that when the cap and device wafer are bonded together, they are bonded such that they form a hermetic seal. In this manner, the electronic component is provided within a hermetically sealed cavity, protecting it from environmental effects such as moisture.

Figure 5:
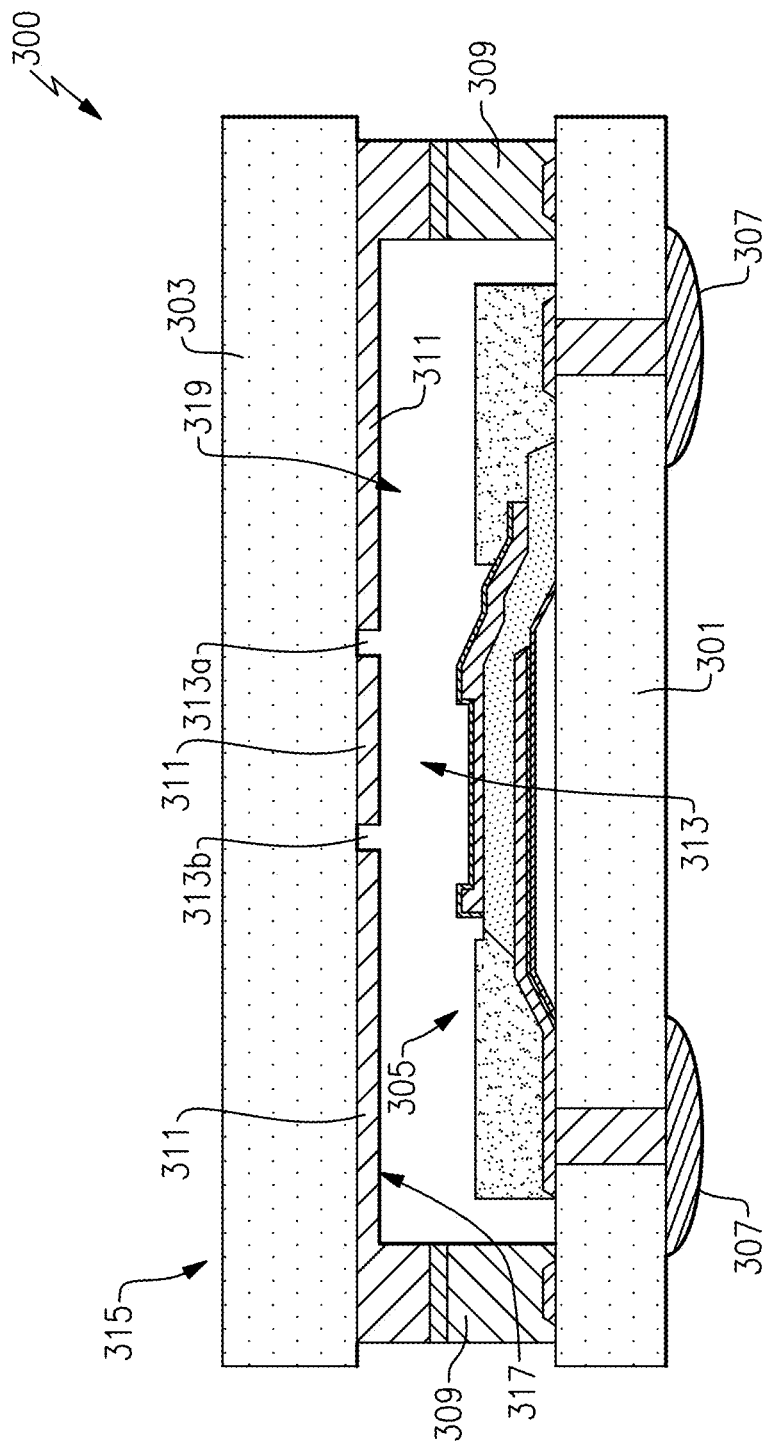
FIG. 5 is a die having a marking according to aspects of the present invention.

A die manufactured by the method of FIG. 4B is illustrated in FIG. 5. Die 300 comprises a device wafer 301 having an electronic component 305 disposed thereon. In this example, the electronic component is a BAW resonator, though other electronic components could be used. A cap wafer (i.e., a substrate) 303 is disposed adjacent and parallel to the device wafer 301, and is bonded to the device wafer 301 with pillars 309. The device wafer 301 and the cap wafer 303 may have thicknesses of between 50 µm and 100 µm, for example 70 µm. The bonding is preferably performed using transient liquid phase (TLP) bonding, whereby a tin layer on the cap wafer 303 is bonded to a gold layer on the device wafer 301 under heat and pressure. Preferably, the device wafer 301, cap wafer 305 and pillars 309 are bonded to form a hermetically sealed cavity 319, with the electronic component 305 being disposed within the cavity 319. Contacts 307 are provided to enable the electronic component 305 to be connected to external (with respect to cavity 319) components and circuitry.

The cap wafer 303 has an outer surface 315, facing away from the device wafer 301, and an inner surface 317, facing towards the device wafer 301. The inner surface 317 has a metal layer 311, also called a shielding layer 311, on the cap wafer 303 to prevent (or minimize) electrical interference that may affect the performance of the electronic component 305. In particular, the metal layer 311 is provided on a portion of the inner surface 317 that is within the cavity 319, i.e., between pillars 309. Preferably, the metal layer 311 is a copper layer, and has a thickness of 5 µm or similar (e.g., between 1 µm and 10 µm).

A marking 313 is provided on the inner surface 317 of the cap wafer 303. In particular, the marking 313 is provided within the metal layer 311, as illustrated by the hole portions 313a, 313b. Preferably, the marking 313 passes through the entire depth of the metal layer 311, as illustrated in FIG. 5. This enables the marking 313 to be viewed, from outside the die 300, using an infrared (IR) microscope, e.g., operating at or around 1,100 nm wavelength. This is because the IR microscope can penetrate the silicon of the cap wafer 303 and the gaps in the metal layer (i.e., holes 313a, 313b) that make up the marking 313, but not the metal layer 311 itself. In this manner, despite being provided on the inner surface 317 of the cap wafer 303, the marking 313 can still be viewed from outside the die 300.

Preferably, the marking 313, or each character (i.e., letters and/or numbers) of the marking, is formed backwards when viewed from the side of the inner surface 317 of the cap wafer 303. In this manner, when viewed through the cap wafer 317 from the side of the outer surface 315, opposite the inner surface 317, each of the letters and/or numbers are correctly oriented. For example, if the marking 313 is desired to look like an "R" when viewed, it will preferably be formed as an " Я " in the metal layer 311, when viewed from the side of the metal layer 311. Given that the marking is viewed through the cap wafer 303 using an IR microscope in this manner, by reversing marking 311 in this way within the metal layer 311 the marking 311 will appear correctly oriented when viewed with the IR microscope.

As previously noted, there are a number of different methods by which the marking 313 can be formed in the metal layer 311. Some examples of how the marking 313 can be formed will now be discussed in relation to FIGS. 6-9.

Figure 6:
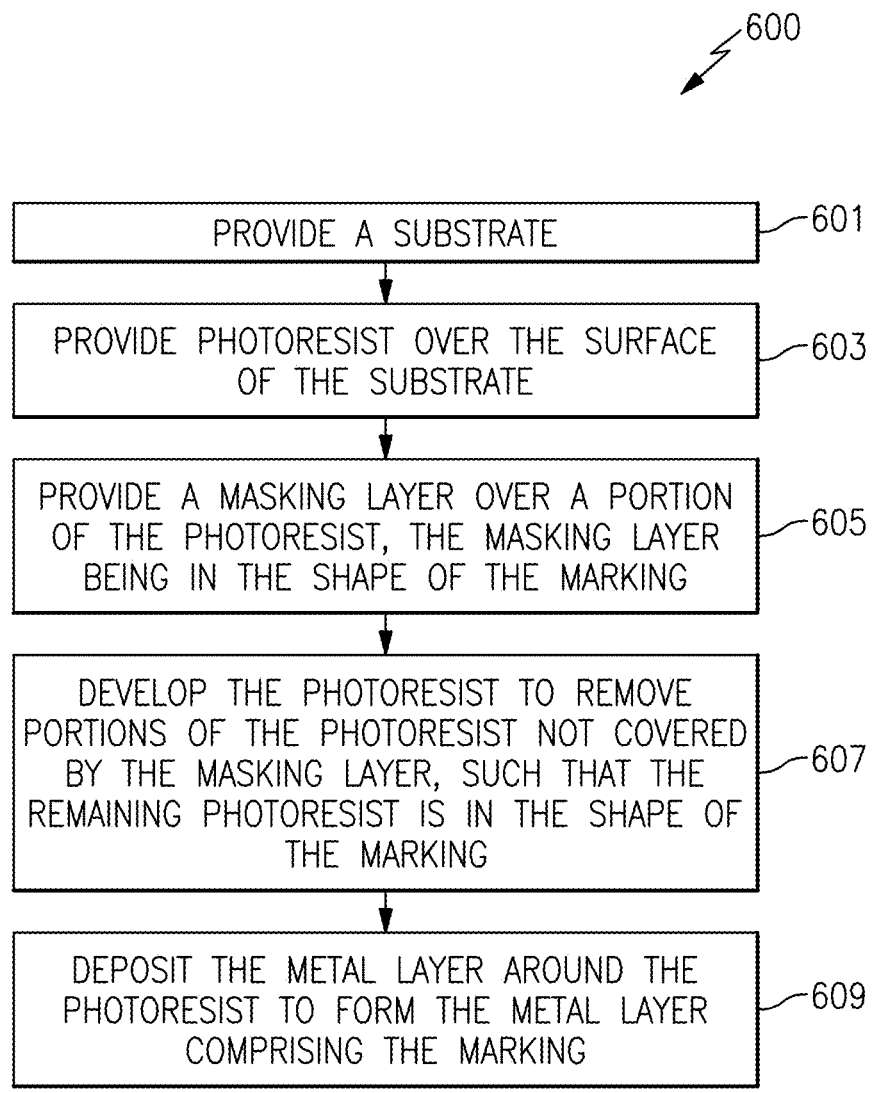
FIG. 6 is a method of forming a marking according to aspects of the present invention.
Figure 7A:
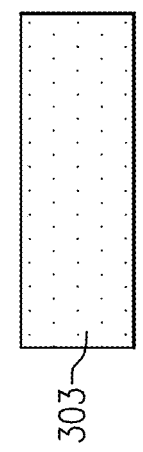
FIGS. 7A-7F show a method of forming a marking according to aspects of the present invention.
Figure 7B:
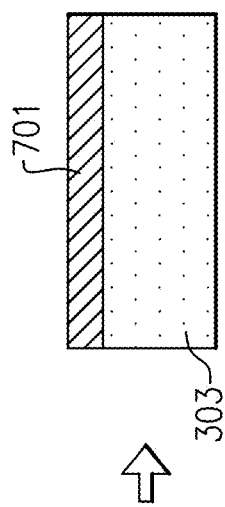
Figure 7C:
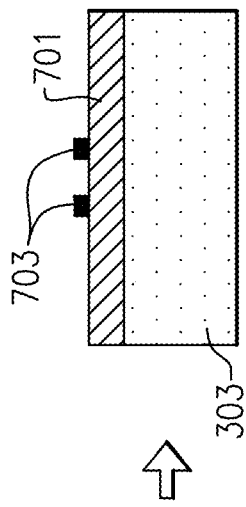
Figure 7D:
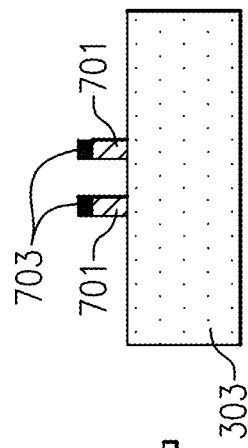
Figure 7E:
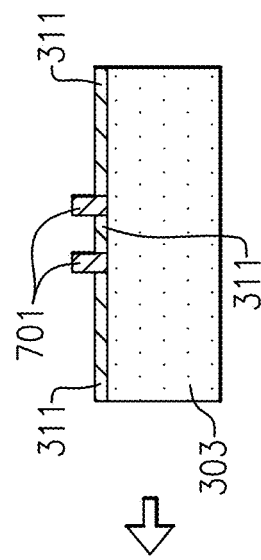
Figure 7F:
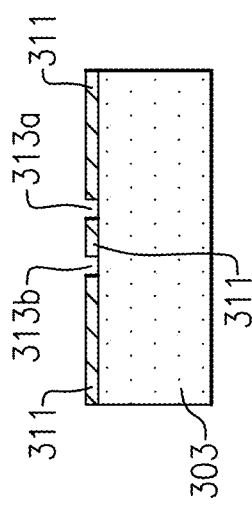

FIGS. 6 and 7 illustrate a first method 600 of providing the metal layer comprising the marking. FIG. 6 is a flowchart of the method 600, whilst FIGS. 7A-7F illustrate the various steps. At step 601 in FIG. 6 and at FIG. 7A, a substrate 303 is provided. At step 603 and FIG. 7B, a photoresist 701 is provided on a surface of the substrate 303. A mask, or masking layer, 703 is then provided over a portion of the photoresist 701 at step 605 and FIG. 7C. The mask is provided in the shape of the marking. For example, if the marking comprises the letter "A", the mask will be in the shape of the letter "A". The photoresist 701 is then developed to remove the portions of the photoresist 701 that are not covered by the mask 703 at step 607 and FIG. 7D, such that the photoresist 701 is left in the shape of the desired marking. After developing the photoresist 701, a metal layer 311 is deposited on the surface of the substrate 303, around the remaining portions of the photoresist 701, at step 609 and FIG. 7E. Because the metal layer 311 is only deposited on the substrate 303 around the photoresist 701, when the photoresist 701 is removed, at FIG. 7F, the metal layer 311 is left with the marking (holes 313a, 313b) therein.

An alternative method, wherein metal is removed from the metal layer to form the marking, is illustrated in FIGS. 8 and 9A-9E. As with FIGS. 6 and 7A-7F, FIG. 8 is a flowchart of a method 800 whilst FIGS. 9A-9E illustrates the various steps. The method begins at step 801 and FIG. 9A, whereby a substrate 303 is provided. A metal layer 311 is then deposited on a surface of the substrate 303 at step 803 and FIG. 9B. At step 805 and FIG. 9C, a mask, or masking layer, 703 is provided. The mask 703 comprises the shape of the desired marking as a hole or cut-out (e.g., like a stencil of the marking) and so if the marking were the letter "A", the mask 703 would comprise a hole in the shape of the letter "A". At step 807 and FIG. 9D, the regions or portions of the metal layer 311 not covered by the mask 703 (e.g., in the hole or cut-out in the shape of the marking) are removed. This may be performed, for example, by chemically etching away the metal layer 311. Because only the regions of the metal layer 311 not covered by the mask 703 are removed, when the mask 703 is removed, at FIG. 9E, the metal layer 311 is left with the marking (holes 313a, 313b) therein.

It will be appreciated by the person skilled in the art that the devices and methods described with respect to the preceding figures are presented in a simplified form in order that aspects of the invention are more clearly presented. In reality, a substrate or die may have other components disposed thereon other than a marking in the metal layer, and the steps relating to the formation of the marking may be a part of other steps that also form other structures or devices, or may incorporated into or between other such steps. That is, the steps in the methods presented in FIGS. 4A, 4B, 7 and 9, for example, need not be adjacent but may have other (unlisted) steps incorporated between the listed steps. A more complete example of a method of forming a cap wafer having a marking in a metal layer is illustrated in FIGS. 10A-10N. FIGS. 10A-10N illustrate the major steps associated with the formation of the cap wafer, but again does not necessarily list all of the steps (e.g., various grinding and planning steps have been omitted).

The first step, illustrated in FIG. 10A, comprises providing a substrate 303, for example in the form of a silicon wafer. A seed layer 721 is then deposited onto the surface of the substrate 303, shown in FIG. 10B. The seed layer 721 typically comprises both a titanium layer on top of the substrate 303 and a copper layer on top of the titanium layer; though in FIGS. 10A-10N the structure of the seed layer 721 is not shown. The seed layer 721 (including its composite parts) may be formed by sputtering.

At FIG. 10C, a layer of photoresist 701 is deposited over the seed layer 721, the photoresist preferably being approximately the depth of the desired thickness of the metal shielding layer 311 (e.g., approximately 5 μm to 10 μm thick), and then at FIG. 10D a masking layer 703 is provided over the photoresist 701. The masking layer 703 is in the shape of the marking, as it corresponds to areas that will not be covered by the metal layer 311. The photoresist 701 is developed such that only the parts of the photoresist 701 covered by the masking layer 703 remain, illustrated in FIG. 10E. Metal, for example copper, is then deposited. The metal then forms the metal shielding layer 311, at FIG. 10F, and remaining portions of the photoresist 701 mean that the metal layer 311 is formed comprising the marking.

After forming the metal layer 311 comprising the marking, the pillars at the edge of the cap wafer, for connecting to the device wafer as shown in FIG. 5, are formed. To do this, a further layer of photoresist 701 is disposed over the existing photoresist 701 and metal layer 311 at FIG. 10G. Another masking layer 703 is then provided at FIG. 10H, this time the masking layer 703 only having gaps corresponding to the positions of the pillars. The photoresist 701 is then developed at FIG. 10I to provide gaps in the photoresist 701 in which the pillars can be formed, and further metal is deposited at 10J to provide the metal pillars connected to the metal layer 311.

Figure 10K:
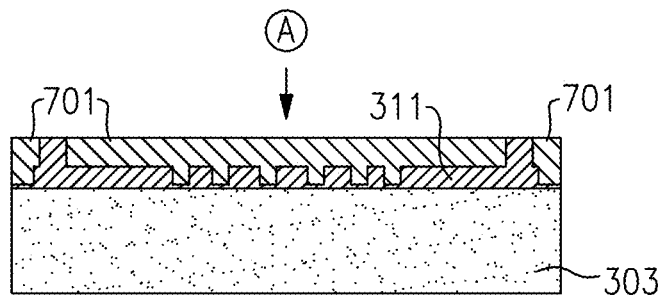
FIGS. 10A-10N show a method of manufacturing a die according to aspects of the present invention.
Figure 10L:
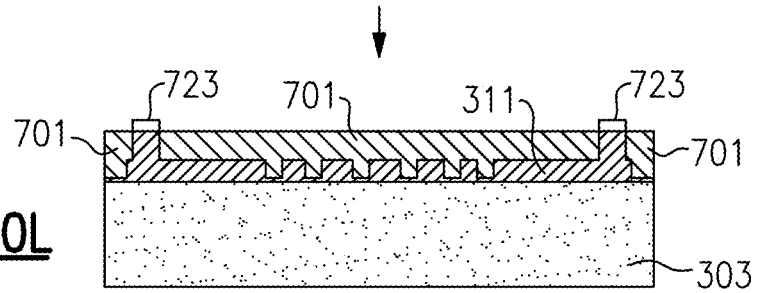
Figure 10M:
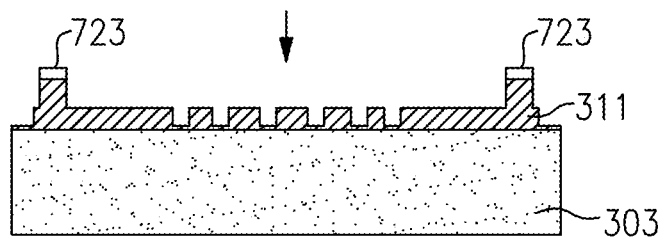
Figure 10N:
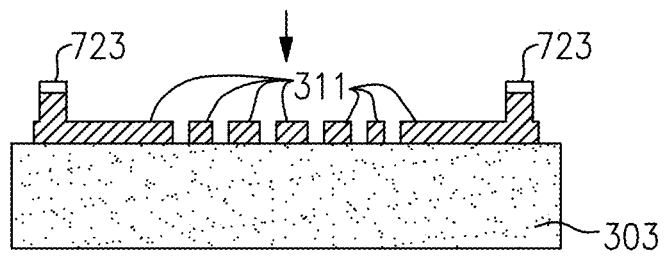

The final steps for preparing the cap wafer for bonding to a device wafer comprise using a surface plane at FIG. 10K to ensure that the tops of the pillars have a smooth surface at the correct height, and then a tin (Sn) layer 723 is deposited over the exposed tops of the pillars at FIG. 10L (the photoresist 701 preventing the tin from being deposited elsewhere). Once the tin layer 723 has been deposited, the photoresist is removed at FIG. 10M, and the remaining exposed portions of the seed layer 721 are etched away at FIG. 10N. The cap wafer may then be cut (diced) from the substrate wafer for bonding to a device wafer.

The substrates or wafers having a marking on, or the die incorporating such a substrate or wafer as a cap wafer, need not be made individually but may be made as part of a batch. That is, a number of markings may be made on a single wafer, each marking corresponding to an individual die, that is then cut or otherwise split into the individual die.

For example, a device wafer may have a plurality of electronic components disposed upon it, with each of the components arranged in groups of one or more component such that each group corresponds to an individual die that will be separated from the others. The cap wafer may correspondingly have a plurality of markings formed in a metal layer disposed over a surface of the cap wafer. Each marking may correspond to one of the groups, that is to say, each marking may correspond to one of the individual dies that will be separated from the others when the wafer is divided.

The device and cap wafers may be cut before or after they are bonded together. If cut after being bonded together, the markings on the cap wafer will need to be positioned in a similar manner to the way the groups of electronic components are arranged on the device wafer, such that, when the cap wafer and the device wafer are aligned and bonded, each marking on the cap wafer will be located adjacent (i.e., in line with when viewed in a direction perpendicular to the planes of the cap and device wafers) to its respective group of electronic components on the device wafer.

In this case, the markings may advantageously comprise information on the position of each die on the wafer from which they are cut, for example in the form of x and y coordinates. In one example, the marking may comprise a polarity mark and seven characters: two characters to specify an x coordinate, two characters to specify a y coordinate, and three characters to specify the product ID, lot ID, and wafer ID.

Furthermore, in some cases, the markings described herein that are provided in a metal layer may be combined with traditional, laser etched markings provided on an outer surface of a cap wafer of a die. This can enable even more information to be included on a die by making use of both the inner and outer surfaces, enabling the desired information to be included on ever smaller die. More important information can be encoded in the marking in the metal layer (as this is less prone to damage that may obscure the marking), while less important information can be including in the laser etched marking on the outer surface of the cap wafer.

Figure 11:
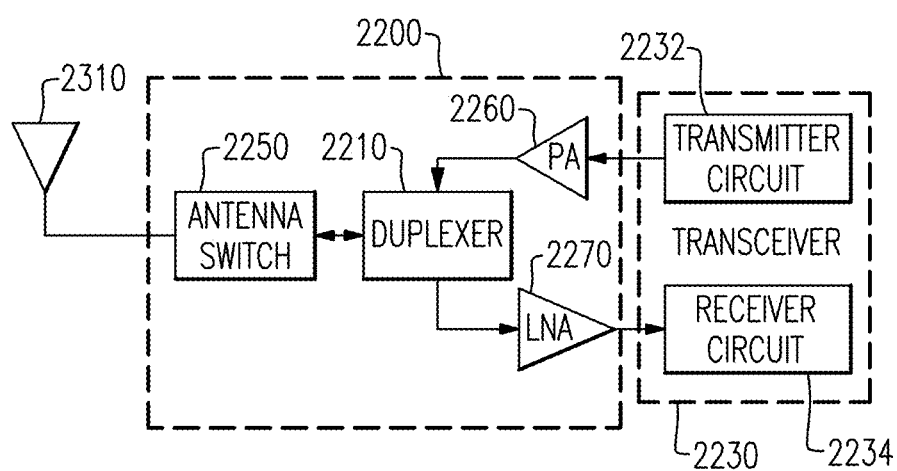
FIG. 11 is a radio-frequency front end module according to aspects of the present invention.

The die 300 of FIG. 5, or any of the other devices described herein or devices made according to the methods described herein, may also be included in a radio-frequency front end (RFFE) module. An exemplary RFFE module is shown in FIG. 11. This figure illustrates a front end module 2200, connected between an antenna 2310 and a transceiver 2230. The front end module 2200 includes a duplexer 2210 in communication with an antenna switch 2250, which itself is in communication with the antenna 2310.

As illustrated, the transceiver 2230 comprises a transmitter circuit 2232. Signals generated for transmission by the transmitter circuit 2232 are received by a power amplifier (PA) module 2260 within the front end module 2200 which amplifies the generated signals from the transceiver 2230. The PA module 2260 can include one or more Pas. The PA module 2260 can be used to amplify a wide variety of RF or other frequency-band transmission signals. For example, the PA module 2260 can receive an enable signal that can be used to pulse the output of the PE to aid in transmitting a wireless local area network (WLAN) signal or any other suitable pulsed signal. The PA module 2260 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the PA module 2260 and associated components including switches and the like can be fabricated on gallium arsenide (GaAs) substrates using, for example, high electron mobility transistors (pHEMT) or insulated-gate bipolar transistors (BiFET), or on a silicon substrate using complementary metal-oxide semiconductor (CMOS) field effect transistors (FETs).

Still referring to FIG. 11, the front end module 2200 may further include a low noise amplifier (LNA) module 2270, which amplifies received signals from the antenna 2310 and provides the amplified signals to a receiver circuit 2234 of the transceiver 2230.

Figure 12:
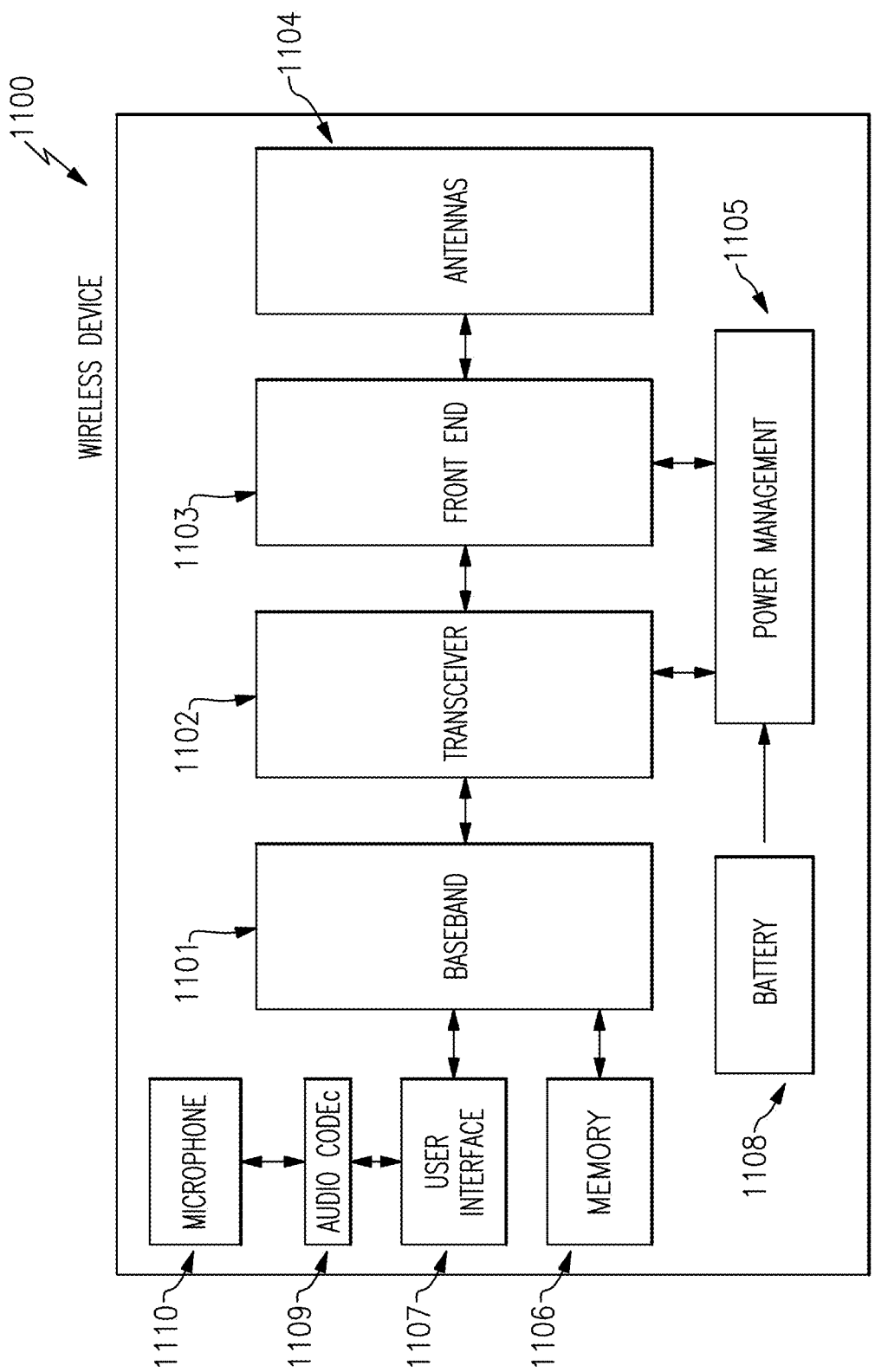
FIG. 12 is a wireless mobile device according to aspects of the present invention.

FIG. 12 is a schematic diagram of a wireless device 1100 that can incorporate aspects of the invention. The wireless device 1100 can be, for example but not limited to, a portable telecommunication device such as, a mobile cellular-type telephone. The wireless device 1100 can include a microphone arrangement 1110, and may include one or more of a baseband system 1101, a transceiver 1102, a front end system 1103 (such as the front end module 2200 of FIG. 11), one or more antennas 1104, a power management system 1105, a memory 1106, a user interface 1107, a battery 1108, and audio codec 1109. The microphone arrangement may supply signals to the audio codec 1109 which may encode analog audio as digital signals or decode digital signals to analog. The audio codec 1109 may transmit the signals to a user interface 1107. The user interface 1107 transmits signals to the baseband system 1101. The transceiver 1102 generates RF signals for transmission and processes incoming RF signals received from the antennas. The front end system 1103 aids in conditioning signals transmitted to and/or received from the antennas 1104. The antennas 1104 can include antennas used for a wide variety of types of communications. For example, the antennas 1104 can include antennas 1104 for transmitting and/or receiving signals associated with a wide variety of frequencies and communications standards. The baseband system 1101 is coupled to the user interface to facilitate processing of various user input and output, such as voice and data. The baseband system 1101 provides the transceiver 1102 with digital representations of transmit signals, which the transceiver 1102 processes to generate RF signals for transmission. The baseband system 1101 also processes digital representations of received signals provided by the transceiver 1102.

As shown in FIG. 11, the baseband system 1101 is coupled to the memory 1106 to facilitate operation of the wireless device 1100. The memory 1106 can be used for a wide variety of purposes, such as storing data and/or instructions to facilitate the operation of the wireless device 1100 and/or to provide storage of user information. The power management system 1105 provides a number of power management functions of the wireless device 1100. The power management system 1105 receives a battery voltage from the battery 1108. The battery 1108 can be any suitable battery for use in the wireless device, including, for example, a lithium-ion battery.

The die 300 of FIG. 5, or any of the other devices described herein or devices made according to the methods described herein, may be incorporated onto one or more dies or components used within the wireless device 1100. In particular, a die incorporating may be incorporated into a radio-frequency module (such as radio-frequency front end module 1103) which may be incorporated into the wireless device 1100. Such a die may incorporate one or more BAW resonators within the cavity formed between a cap wafer and a device wafer. The BAW resonators may be incorporated into a number of different components which may be incorporated into the wireless device 100, including but not limited to various forms of filters and duplexers.

In some embodiments, the substrate is used in a semiconductor component.

In some embodiments, the substrate is integrated into the semiconductor component.

In some embodiments, the masking layer includes an outline of the marking.

In some embodiments, the electronic component includes one or more of a bulk acoustic wave resonator, a Lamb wave resonator, and a surface acoustic wave resonator.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of marking information on a substrate for use in a semiconductor component, the method comprising:
    providing a substrate for use in a semiconductor component;
    providing a metal layer on a surface of the substrate; and
    providing a marking within the metal layer,
    the providing a metal layer on a surface of the substrate and the providing a marking within the metal layer including providing a photoresist in the shape of the marking on the surface of the substrate, and depositing the metal layer around the photoresist to form the metal layer including the marking.

2. The method of claim 1 further comprising integrating the substrate into the semiconductor component.

3. The method of claim 2 wherein the substrate includes one or more cap wafers.

4. The method of claim 3 wherein the marking is provided corresponding to each of the one or more cap wafers and includes information about a position of the cap wafer on the substrate.

5. The method of claim 4 wherein the marking includes a coordinate position.

6. The method of claim 3 wherein the method further comprises:
    providing a device wafer having an electronic component disposed thereon; and
    bonding the cap wafer and the device wafer such that an inner surface of the cap wafer faces the device wafer, the metal layer including the marking being provided on the inner surface of the cap wafer.

7. The method of claim 6 wherein the metal layer is one of a shielding layer and a copper layer.

8. The method of claim 6 wherein the device wafer includes a plurality of electronic components arranged in groups of one or more electronic components, each group corresponding to a separate die, the metal layer including the marking corresponding to each group.

9. The method of claim 8 wherein the marking corresponding to each group is provided on the inner surface of the cap wafer opposite the one or more electronic components of the corresponding group.

10. The method of claim 6 wherein the electronic component includes one or more of a bulk acoustic wave resonator, a Lamb wave resonator, and a surface acoustic wave resonator.

11. The method of claim 1 wherein the surface of the substrate is a surface of a silicon wafer or a treated surface of a silicon wafer.

12. The method of claim 1 wherein the marking includes one or more holes in the metal layer extending through the entire thickness of the metal layer.

13. The method of claim 1 wherein the photoresist in the shape of the marking on the surface of the substrate is provided by:
    providing the photoresist over the surface of the substrate;
    providing a masking layer over a portion of the photoresist, the masking layer being in the shape of the marking; and
    developing the photoresist to remove portions of the photoresist not covered by the masking layer, such that the remaining photoresist is in the shape of the marking.

14. A method of marking information on a substrate for use in a semiconductor component, the method comprising:
    providing a substrate for use in a semiconductor component, the substrate including one or more cap wafers;
    providing a metal layer on a surface of the substrate;
    providing a marking within the metal layer;
    integrating the substrate into the semiconductor component;
    providing a device wafer having an electronic component disposed thereon, the device wafer including a plurality of electronic components arranged in groups of one or more electronic components, each group corresponding to a separate die, the metal layer including the marking corresponding to each group;
    bonding the cap wafer and the device wafer such that an inner surface of the cap wafer faces the device wafer, the metal layer including the marking being provided on the inner surface of the cap wafer; and
    separating each die subsequent to bonding the cap wafer and the device wafer.

15. A method of marking information on a substrate for use in a semiconductor component, the method comprising:
    providing a substrate for use in a semiconductor component, the substrate including one or more cap wafers;
    providing a metal layer on a surface of the substrate;
    providing a marking within the metal layer;
    integrating the substrate into the semiconductor component;
    providing a device wafer having an electronic component disposed thereon; and
    bonding the cap wafer and the device wafer such that an inner surface of the cap wafer faces the device wafer, the metal layer including the marking being provided on the inner surface of the cap wafer, the bonding of the cap wafer and the device wafer including forming a hermetic seal around the electronic component.

16. A method of marking information on a substrate for use in a semiconductor component, the method comprising:
    providing a substrate for use in a semiconductor component, the substrate including one or more cap wafers;
    providing a metal layer on a surface of the substrate;
    providing a marking within the metal layer;
    integrating the substrate into the semiconductor component;
    providing a device wafer having an electronic component disposed thereon; and
    bonding the cap wafer and the device wafer such that an inner surface of the cap wafer faces the device wafer, the metal layer including the marking being provided on the inner surface of the cap wafer, and the marking including one or more letters and/or numbers and each of the letters and/or numbers being formed backwards on the inner surface of the cap wafer such that when viewed through the cap wafer from an outer surface opposite the inner surface each of the letters and/or numbers are correctly oriented.

* * * * *